(12) United States Patent
Takeo et al.

(10) Patent No.: US 10,240,026 B2
(45) Date of Patent: Mar. 26, 2019

(54) PHOTOCURABLE RESIN COMPOSITION

(71) Applicant: THREE BOND CO., LTD., Hachioji-shi, Tokyo (JP)

(72) Inventors: Yuko Takeo, Hachioji (JP); Naoya Otsuki, Hachioji (JP)

(73) Assignee: THREE BOND CO., LTD., Hachioji-shi, Tokyo (JP)

( * ) Notice: Subject to any disclaimer, the term of this patent is extended or adjusted under 35 U.S.C. 154(b) by 0 days.

(21) Appl. No.: 15/513,578

(22) PCT Filed: Jul. 10, 2015

(86) PCT No.: PCT/JP2015/069957
§ 371 (c)(1),
(2) Date: Mar. 23, 2017

(87) PCT Pub. No.: WO2016/051914
PCT Pub. Date: Apr. 7, 2016

(65) Prior Publication Data
US 2017/0283584 A1  Oct. 5, 2017

(30) Foreign Application Priority Data
Sep. 29, 2014 (JP) ................. 2014-197803

(51) Int. Cl.
| | | |
|---|---|---|
| *C08F 2/46* | (2006.01) | |
| *C08F 2/50* | (2006.01) | |
| *C08G 61/04* | (2006.01) | |
| *C08K 5/1545* | (2006.01) | |
| *C09D 7/40* | (2018.01) | |
| *C08F 2/44* | (2006.01) | |
| *C09D 4/00* | (2006.01) | |
| *C09J 4/00* | (2006.01) | |
| *C09J 11/06* | (2006.01) | |
| *C09K 3/10* | (2006.01) | |
| *C08K 5/375* | (2006.01) | |
| *C08F 220/18* | (2006.01) | |
| *C08K 5/17* | (2006.01) | |
| *G03F 7/027* | (2006.01) | |
| *C09D 7/41* | (2018.01) | |
| *C09D 7/63* | (2018.01) | |
| *G03F 7/029* | (2006.01) | |
| *G03F 7/031* | (2006.01) | |
| *G03F 7/038* | (2006.01) | |
| *G03F 7/105* | (2006.01) | |

(52) U.S. Cl.
CPC .............. *C08K 5/1545* (2013.01); *C08F 2/44* (2013.01); *C08F 2/50* (2013.01); *C08F 220/18* (2013.01); *C08K 5/17* (2013.01); *C08K 5/375* (2013.01); *C09D 4/00* (2013.01); *C09D 7/40* (2018.01); *C09D 7/41* (2018.01); *C09D 7/63* (2018.01); *C09J 4/00* (2013.01); *C09J 11/06* (2013.01); *C09K 3/10* (2013.01); *G03F 7/027* (2013.01); *G03F 7/029* (2013.01); *G03F 7/031* (2013.01); *G03F 7/038* (2013.01); *G03F 7/105* (2013.01)

(58) Field of Classification Search
CPC .............................. C08K 5/1545; C08K 5/375
USPC ................. 522/31, 6, 71, 189, 184, 1; 520/1
See application file for complete search history.

(56) References Cited

U.S. PATENT DOCUMENTS

2006/0057492 A1* 3/2006 Kunita ................ B41C 1/1008
430/270.1

FOREIGN PATENT DOCUMENTS

| | | | |
|---|---|---|---|
| CN | 103926795 | A | 7/2014 |
| JP | H06-148883 | A | 5/1994 |
| JP | H11-060962 | A | 3/1999 |
| JP | 2000-273109 | A | 10/2000 |
| JP | 2004-219690 | A | 8/2004 |
| JP | 2012-167262 | * | 9/2012 |
| JP | 2013-082924 | A | 5/2013 |
| JP | 2013-194156 | A | 9/2013 |
| JP | 2014-025021 | A | 2/2014 |
| WO | 2011105011 | A1 | 9/2011 |

OTHER PUBLICATIONS

Nakayama et al, JP 2012-167262 Machine Translation Part 1, dated Sep. 6, 2012 (Year: 2012).*
Nakayama et al, JP 2012-167262 Machine Translation Part 2, dated Sep. 6, 2012 (Year: 2012).*
Chinese Office Action issued for Chinese Application No. 201580052506.X dated Nov. 16, 2017 (including English translation).
International Preliminary Report on Patentability dated Apr. 4, 2017 which issued in the Patent Application No. PCT/JP2015/069957, including an English translation.
International Search Report and Written Opinion dated Oct. 20, 2015 in PCT Application No. PCT/JP2015/069957.
Chinese Office Action for related application No. 201580052506, dated Jan. 31, 2018 (with English translation).
Supplementary European Search Report dated May 2, 2018, which issued in the corresponding Patent Application No. 15847195.3.

* cited by examiner

*Primary Examiner* — Jessica Whiteley
(74) *Attorney, Agent, or Firm* — Dickinson Wright PLLC

(57) ABSTRACT

An object of the present invention is to provide a photocurable resin composition having excellent thick-film curability and further excellent storage stability, and a cured product of the photocurable resin composition has a high concealing effect.
The present invention is a photocurable resin composition containing components (A) to (E):
  a component (A): a leuco dye;
  a component (B): a photoacid generator;
  a component (C): a radical polymerizable compound (except for a (meth)acrylate having a tertiary amine skeleton);
  a component (D): a photoradical polymerization initiator; and
  a component (E): a tertiary amine compound.

9 Claims, No Drawings

PHOTOCURABLE RESIN COMPOSITION

TECHNICAL FIELD

The present invention relates to a photocurable resin composition in which the photocurable resin composition have excellent thick-film curability and a cured product of the photocurable resin composition has a high concealing effect, and also the photocurable resin composition have excellent storage stability.

BACKGROUND ART

Conventionally, a photocurable resin composition having a high concealing effect has been widely used in a coating material for a flexible wiring board (see JP 2013-194156 A), a casting material for a replica of a prototype model (see JP H11-060962 A), a black stripe of lenticular lens (see JP 2013-082924 A), an adhesive agent for assembling an electronic equipment and the like (see JP 2014-025021 A), or the like. As a typical technique of imparting a concealing effect to a photocurable resin composition, mixing of carbon black of pigment can be mentioned. However, the concealing effect can be obtained, but most of active energy rays such as UV rays are absorbed into the carbon black, therefore, there has been a problem of causing poor curability when the concentration of the pigment is extremely high.

Under these circumstances, in JP H11-060962 A, there is a disclosure of a photosensitive resin composition for casting, which contains a photoradical polymerization initiator, a leuco dye having a characteristic of coloring with an acid, a photoacid generator, and an ethylenically unsaturated compound, and the cured product has excellent thick-film curability while being black. This utilizes the fact that the generation speed of the "radical species generated by light irradiation" is faster than the generation speed of the "acid generated by light irradiation". That is, the photosensitive resin composition is cured by the transmission of light to the extent of the deep portion before being blackened with an acid.

SUMMARY OF INVENTION

However, excellent thick-film curability is required in order to apply in a casting resin, but the thick-film curability has been insufficient in the photosensitive resin composition for casting, which is disclosed in JP H11-060962 A.

The present inventors have conducted intensive studies in view of the above-described problems. As a result, the present inventors have completed the present invention relating to a photocurable resin composition. The gist of the present invention will be described below. An embodiment of the present invention is a photocurable resin composition containing components (A) to (E):

a component (A): a leuco dye;
a component (B): a photoacid generator;
a component (C): a radical polymerizable compound (except for a (meth)acrylate having a tertiary amine skeleton);
a component (D): a photoradical polymerization initiator; and
a component (E): a tertiary amine compound.

DESCRIPTION OF EMBODIMENTS

An embodiment of the present invention is a photocurable resin composition containing components (A) to (E):

a component (A): a leuco dye;
a component (B): a photoacid generator;
a component (C): a radical polymerizable compound (except for a (meth)acrylate having a tertiary amine skeleton);
a component (D): a photoradical polymerization initiator; and
a component (E): a tertiary amine compound.

By this constitution, the photocurable resin composition can be obtained in which the photocurable resin composition has excellent thick-film curability and a cured product has a high concealing effect. In addition, the above-described photocurable resin can have excellent storage stability.

Hereinafter, embodiments of the present invention will be described. However, the present invention is not limited only to the following embodiments.

In the present specification, the expression "X to Y" indicating the range means "X or more to Y or less", and "weight" and "mass", "% by weight" and "% by mass", and "parts by weight" and "parts by mass" are treated as synonyms, respectively. Further, unless otherwise specifically noted, operations and measurements of properties and the like are performed under the conditions of room temperature (20 to 25° C.)/relative humidity 40 to 50% RH. In addition, the term "(meth)acrylate" means "acrylate" or "methacrylate".

<Component (A)>

A leuco dye that is a component (A) of the present invention is a compound developing color by coming into contact with an acid, and can give a concealing effect to a cured product. Further, the leuco dye can make the color black, blue, green, red, or the like depending on the type, but from the viewpoint of being excellent in the concealing effect, a leuco dye capable of developing a black color is preferred.

Among the components (A), the leuco dye capable of developing a black color is not particularly limited, but examples of the leuco dye capable of developing a black color include 3-dibutylamino-6-methyl-7-anilinofluoran, 3-dipropylamino-6-methyl-7-anilinofluoran, 3-diethylamino-6-methyl-7-anilinofluoran, 3-dimethylamino-6-methyl-7-anilinofluoran, 3-dimethylamino-6-methyl-7-xylidinofluorane, and 3-(4-diethylamino-2-ethoxyphenyl)-3-(1-ethyl-2-methylindole-3-yl)-4-azaphthalide. These can be used singly or by mixing two or more kinds thereof. Among them, from the viewpoint of the concealing effect of the cured product and the thick-film curability of the photocurable resin composition, 3-dibutylamino-6-methyl-7-anilinofluoran, and 3-diethylamino-6-methyl-7-anilinofluoran, are preferred.

The product available on the market of the component (A) of the present invention is not particularly limited, but examples of the product include S-205, BLACK305, ETAC, BLACK100, and NIR BLACK78 (manufactured by YAMADA CHEMICAL CO., LTD.), and ODB, ODB-2, ODB-4, ODB-250, and Black-XV (manufactured by Yamamoto Chemicals, Inc.).

The preferred mixing amount of the component (A) of the present invention is, based on 100 parts by mass of the component (C) described later, in the range of 0.01 to 20 parts by mass, preferably 0.05 to 10 parts by mass, and more preferably 0.5 to 5 parts by mass. When the component (A) is 0.01 part by mass or more, the cured product can have a high concealing effect. Further, when the component (A) is 20 parts by mass or less, the photocurable resin composition can have excellent thick-film curability.

<Component (B)>

The photoacid generator that is a component (B) of the present invention is a compound generating an acid such as Lewis acid, or Bronsted acid by the irradiation with active energy rays. With the acid generated by the component (B), the color of the leuco dye that is a component (A) can be developed. Further, from the viewpoint of capable of achieving both of the concealing effect and the thick-film curability of the photocurable resin composition, a photoacid generator having an absorption at a wavelength of 365 nm or more is preferred. In addition, as the component (B), the photoacid generator can be classified roughly into an onium salt-based photoacid generator and a nonionic photoacid generator.

The onium salt to be used in the present invention is not particularly limited, but examples of the onium salt include an aryl iodonium salt, an aryl sulfonium salt, and an aryl diazonium salt, each of which has a counter anion such as a hexafluoroantimonate anion, a tetrafluoroborate anion, a hexafluorophosphate anion, an anion represented by $[PR_6]^-$ (wherein R each independently represents a fluorine atom or a fluorinated alkyl group having 1 to 12 carbon atoms, and at least one of Rs is a fluorinated alkyl group having 1 to 12 carbon atoms), an anion represented by $[BR_4]^-$ (wherein R each independently represents a fluorine atom or a fluorinated alkyl group having 1 to 12 carbon atoms, and at least one of Rs is a fluorinated alkyl group having 1 to 12 carbon atoms), an anion represented by $[SbR_6]^-$ (wherein R each independently represents a fluorine atom or a fluorinated alkyl group having 1 to 12 carbon atoms, and at least one of Rs is a fluorinated alkyl group having 1 to 12 carbon atoms), a hexachloroantimonate anion, a trifluoromethanesulfonate ion, or a fluorosulfonic acid ion. These can be used singly or by mixing of two or more kinds thereof. Among them, from the viewpoint of the concealing effect of the cured product and the thick-film curability of the photocurable resin composition, an aryl sulfonium salt having any one of the counter anions of a hexafluoroantimonate anion, a tetrafluoroborate anion, a hexafluorophosphate anion, an anion represented by $[PR_6]^-$, an anion represented by $[BR_4]^-$, and an anion represented by $[SbR_6]^-$ is preferred. From the viewpoint that the load on the environment is less, an aryl sulfonium salt having any one of the counter anions of a tetrafluoroborate anion, a hexafluorophosphate anion, an anion represented by $[PR_6]^-$, and an anion represented by $[BR_4]^-$ is more preferred. Specifically, a triarylsulfonium-hexafluorophosphate salt, or the like can be mentioned.

Examples of the product available on the market of the onium salt-based photoacid generator include IRGACURE250, and IRGACURE270 (manufactured by BASF), WPI-113, WPI-116, WPI-169, WPI-170, WPI-124, WPAG-638, WPAG-469, WPAG-370, WPAG-367, and WPAG-336 (manufactured by Wako Pure Chemical Industries, Ltd.), B2380, B2381, C1390, D2238, D2248, D2253, I0591, T1608, T1609, T2041, and T2042 (manufactured by TOKYO CHEMICAL INDUSTRY CO., LTD.), AT-6992, and At-6976 (manufactured by ACETO), CPI-100, CPI-100P, CPI101A, CPI-200K, and CPI-210S (manufactured by San-Apro Ltd.), SP-056, SP-066, SP-130, SP-140, SP-150, SP-170, SP-171, and SP-172 (manufactured by ADEKA CORPORATION), CD-1010, CD-1011, and CD-1012 (manufactured by Sartomer Co., Ltd.), SAN-AID SI-60, SI-80, SI-100, SI-60L, SI-80L, SI-100L, SI-L145, SI-L150, SI-L160, SI-L110, and SI-L147 (manufactured by SANSHIN CHEMICAL INDUSTRY CO., LTD.), and PI2074 (manufactured by Rhodia Japan, Ltd.), but not particularly limited to these ones.

Examples of the nonionic photoacid generator include a phenacyl sulfone type photoacid generator, an o-nitrobenzyl ester type photoacid generator, an iminosulfonate type photoacid generator, and a N-hydroxyimide sulfonic acid ester type photoacid generator, but not limited to these ones. These can be used singly or by mixing two or more kinds thereof. Specific examples of the nonionic photoacid generator include sulfonyldiazomethane, oxime sulfonate, imide sulfonate, 2-nitrobenzyl sulfonate, disulfone, pyrogallol sulfonate, p-nitrobenzyl-9,10-dimethoxyanthracene-2-sulfonate, N-sulfonyl-phenylsulfonamido, trifluoromethanesulfonic acid-1,8-naphthalimide, nonafluorobutanesulfonic acid-1,8-naphthalimide, perfluorooctanesulfonic acid-1,8-naphthalimide, pentafluorobenzenesulfonic acid-1,8-naphthalimide, nonafluorobutanesulfonic acid-1,3,6-trioxo-3,6-dihydro-1H-11-thia-azacyclopentaanthracene-2-yl ester, nonafluorobutanesulfonic acid-8-isopropyl-1,3,6-trioxo-3,6-dihydro-1H-11-thia-2-azacyclopentaanthracene-2-yl ester, 1,2-naphthoquinone-2-diazido-5-sulfonic acid chloride, 1,2-naphthoquinone-2-diazido-4-sulfonic acid chloride, 1,2-benzoquinone-2-diazido-4-sulfonic acid chloride, 1,2-naphthoquinone-2-diazido-5-sulfonic acid sodium salt, 1,2-naphthoquinone-2-diazido-4-sulfonic acid sodium salt, 1,2-benzoquinone-2-diazido-4-sulfonic acid sodium salt, 1,2-naphthoquinone-2-diazido-5-sulfonic acid potassium salt, 1,2-naphthoquinone-2-diazido-4-sulfonic acid potassium salt, 1,2-benzoquinone-2-diazido-4-sulfonic acid potassium salt, 1,2-naphthoquinone-2-diazido-5-methyl sulfonic acid, and 1,2-benzoquinone-2-diazido-4-methyl sulfonic acid.

Examples of the product available on the market of the nonionic photoacid generator include WPAG-145, WPAG-149, WPAG-170, and WPAG-199 (manufactured by Wako Pure Chemical Industries, Ltd.), D2963, F0362, M1209, and M1245 (manufactured by TOKYO CHEMICAL INDUSTRY CO., LTD.), SP-082, SP-103, SP-601, and SP-606 (manufactured by ADEKA CORPORATION), SIN-11 (manufactured by SANBO CHEMICAL IND. CO., LTD), and NT-1TF (manufactured by San-Apro Ltd.)

The preferred mixing amount of the component (B) of the present invention is, based on 100 parts by mass of the component (C) described later, in the range of 0.01 to 20 parts by mass, more preferably 0.01 to 10 parts by mass, and furthermore preferably 0.3 to 10 parts by mass. When the component (B) is 0.01 part by mass or more, the effect of developing the color of the leuco dye that is a component (A) is increased, therefore, the cured product can have a high concealing effect. Further, when the component (B) is 20 parts by mass or less, the cured product can have sufficient heat resistance. In addition, from the viewpoint of the color development, it is preferred that the component (B) is mixed in an amount of 0.1 to 20 parts by mass based on one part by mass of the component (A).

<Component (C)>

As the radical polymerizable compound that is a component (C) of the present invention, a compound having an ethylenically unsaturated group, which is usually used for an adhesive agent, a coating material, or the like, can be used, and specifically, a (meth)acryloyl group-containing compound, and the like can be mentioned. As the component (C), for example, monofunctional, bifunctional, trifunctional, and polyfunctional monomers, and an oligomer can be used. These can be used alone or as a mixture of two or more kinds thereof. Among them, from the viewpoint of being excellent in the photocurability and in the properties of the cured product, the component (C) contains an oligomer and a monomer, that is, contains preferably an oligomer and at least one of monofunctional, bifunctional, trifunctional, and polyfunctional monomers. Further, a (meth)acrylate having a tertiary amine skeleton in the present invention is treated as the component (E) described later.

Examples of the monofunctional monomer include acrylic acid, ethyl (meth)acrylate, n-butyl (meth)acrylate, tert-butyl (meth)acrylate, isobutyl methacrylate, 2-ethylhexyl (meth)acrylate, isodecyl (meth)acrylate, butoxydiethylene glycol (meth)acrylate, methoxypolyethylene glycol (meth)acrylate, 2-methacryloyloxyethyl succinic acid, 2-methacryloyloxyethyl hexahydrophthalic acid, glycidyl (meth)acrylate, lauryl (meth)acrylate, stearyl (meth)acrylate, tetrahydrofurfuryl (meth)acrylate, caprolactone-modified tetrahydrofurfuryl (meth)acrylate, cyclohexyl (meth)acrylate, dicyclopentanyl (meth)acrylate, dicyclopentenyl (meth)acrylate, dicyclopentenyloxy (meth)acrylate, isobornyl (meth)acrylate, adamantyl (meth)acrylate, benzyl (meth)acrylate, phenyl (meth)acrylate, phenoxyethyl (meth)acrylate, phenoxydiethylene glycol (meth)acrylate, phenoxytetraethylene glycol (meth)acrylate, nonylphenoxyethyl (meth)acrylate, butoxyethyl (meth)acrylate, 2-hydroxyethyl (meth)acrylate, 2-hydroxypropyl (meth)acrylate, 4-hydroxybutyl (meth)acrylate, glycerol (meth)acrylate, trifluoroethyl (meth)acrylate, methacryloxyethyl acid phosphate, 2-hydroxyethyl methacrylic acid phosphate, γ-methacryloxypropyltrimethoxysilane, and γ-acryloxypropyltrimethoxysilane. From the viewpoint of the compatibility of the component (A) and component (B) of the present invention, and of being excellent in the curability, cyclohexyl (meth)acrylate, dicyclopentanyl (meth)acrylate, dicyclopentenyl (meth)acrylate, dicyclopentenyloxy (meth)acrylate, isobornyl (meth)acrylate, adamantyl (meth)acrylate, benzyl (meth)acrylate, phenyl (meth)acrylate, phenoxyethyl (meth)acrylate, 2-hydroxyethyl (meth)acrylate, 2-hydroxypropyl (meth)acrylate, 4-hydroxybutyl (meth)acrylate, and the like are preferred.

Examples of the bifunctional monomer include ethylene glycol di(meth)acrylate, diethylene glycol di(meth)acrylate, triethylene glycol di(meth)acrylate, tetraethylene glycol dimethacrylate, 1,6-hexanediol di(meth)acrylate, 1,9-nonanediol di(meth)acrylate, glycerin di(meth)acrylate, neopentyl glycol di(meth)acrylate, stearic acid-modified pentaerythritol di(meth)acrylate, dicyclopentenyl diacrylate, di(meth)acryloyl isocyanurate, alkylene oxide-modified bisphenol di(meth)acrylate, and dimethylol-tricyclodecane diacrylate.

Examples of the trifunctional monomer include trimethylolpropane tri(meth)acrylate, pentaerythritol tri(meth)acrylate, and tris(acryloyloxyethyl) isocyanurate.

Examples of the polyfunctional monomer include ditrimethylol propane tetra(meth)acrylate, pentaerythritol tetra(meth)acrylate, dipentaerythritol monohydroxy penta(meth)acrylate, alkyl-modified dipentaerythritol pentaacrylate, dipentaerythritol hexa(meth)acrylate, and isocyanuric acid EO-modified di- and triacrylate.

These monofunctional, bifunctional, trifunctional, and polyfunctional monomers can be used alone or as a mixture of two or more kinds thereof.

Examples of the oligomer include urethane (meth)acrylate having a polybutadiene skeleton, urethane (meth)acrylate having a hydrogenated polybutadiene skeleton, urethane (meth)acrylate having a polycarbonate skeleton, urethane (meth)acrylate having a polyether skeleton, urethane (meth)acrylate having a polyester skeleton, urethane (meth)acrylate having a castor oil skeleton, isoprene-based (meth)acrylate, hydrogenated isoprene-based (meth)acrylate, epoxy (meth)acrylate, and (meth)acrylic group-containing acrylic polymer.

<Component (D)>

The photoradical polymerization initiator that is a component (D) used in the present invention is not limited as long as being a compound generating radicals by the irradiation with active energy rays. Further, from the viewpoint of capable of achieving both of the concealing effect of the cured product and the thick-film curability of the photocurable resin composition, a photoradical polymerization initiator having an absorption at a wavelength of 365 nm or more is preferred. In addition, examples of the component (D) include an acetophenone-based photoradical polymerization initiator, a benzoin-based photoradical polymerization initiator, a benzophenone-based photoradical polymerization initiator, a thioxanthone-based photoradical polymerization initiator, an acylphosphine oxide-based photoradical polymerization initiator, and a titanocene-based photoradical polymerization initiator. Among them, from the viewpoint of being excellent in the thick-film curability of the photocurable resin composition and the concealing effect of the cured product, it is preferred that at least one of an acetophenone-based photoradical polymerization initiator and an acylphosphine oxide-based photoradical polymerization initiator is contained. Further, these may be used alone or in combination of two or more kinds thereof.

Examples of the acetophenone-based photoradical polymerization initiator include diethoxy acetophenone, 2-hydroxy-2-methyl-1-phenyl-propane-1-one, benzyl dimethyl ketal, 4-(2-hydroxyethoxy)phenyl-(2-hydroxy-2-propyl)ketone, 1-hydroxy-cyclohexyl-phenyl-ketone, 2-methyl-2-morpholino (4-thiomethylphenyl)propane-1-one, 2-benzyl-2-dimethylamino-1-(4-morpholinophenyl)butanone, and 2-hydroxy-2-methyl-1-[4-(1-methylvinyl) phenyl]propanone oligomer, but are not limited to these ones. Examples of the product available on the market of the acetophenone-based photoradical polymerization initiator include IRGACURE 184, DAROCUR 1173, IRGACURE 2959, IRGACURE 127 (manufactured by BASF), and ESACURE KIP-150 (manufactured by Lamberti s.p.a.).

Examples of the acylphosphine oxide-based photoradical polymerization initiator include bis(2,4,6-trimethylbenzoyl)-phenyl-phosphine oxide, and 2,4,6-trimethylbenzoyl-diphenyl-phosphine oxide, but are not limited to these ones. Examples of the product available on the market of the acylphosphine oxide-based photoradical polymerization initiator include LUCIRIN TPO, IRGACURE819, and IRGACURE819DW (manufactured by BASF).

The mixing amount of the component (D) of the present invention is, based on 100 parts by mass of the component (C), preferably 0.1 to 15 parts by mass, and more preferably 1 to 10 parts by mass. When the mixing amount of the component (D) is 0.1 part by mass or more, the thick-film curability of the photocurable resin composition with active energy rays can be improved, and when the mixing amount of the component (D) is 15 parts by mass or less, the storage stability of the photocurable resin composition can be improved.

<Component (E)>

By combining the tertiary amine compound that is a component (E) of the present invention with components (A) to (D) of the present invention, a photocurable resin composition achieving both of the excellent storage stability and the excellent thick-film curability can be provided. As the component (E), from the viewpoint of the storage stability of the photocurable resin composition, a compound having only a tertiary amino group without containing any primary or secondary amino groups is preferred. Further, the reason why the thick-film curability of the photocurable resin composition is improved by the component (E) is not clear, but it is presumed to be attributed to the fact that the development of the color of leuco dye with an acid can be retarded by the component (E), and light can be transmitted to the extent of the deep portion during film formation. Furthermore, the reason why the storage stability of the photocurable resin composition is improved by the component (E) is not clear, but it is considered that when a primary or secondary amine compound is contained, Michael addition reaction occurs between the primary or secondary amine compound and the component (C), and the storage stability of the photocurable resin composition is deteriorated. In addition, it is presumed that if the component (E) of the present invention is used, Michael addition reaction with the component (C) does not occur, therefore, the storage stability of the photocurable resin composition is improved. However, the technical scope of the present invention is not limited by the reasons described above.

The component (E) is not particularly limited, but examples of the component (E) include a tertiary amine compound in which at least one of the substituents is a straight or branched hydroxyalkyl group having 1 to 8 carbon atoms, such as N-phenyl diethanolamine, N-methyl diethanolamine, p-methylphenyl diethanolamine, N-ethyl diethanolamine, N-propyl diethanolamine, N-butyl diethanolamine, triethanolamine, tributanolamine, triisopropanolamine, N-methyl diethanolamine, and N-methyl dimethanolamine; trimethylamine, triethylamine, tributylamine, N,N-dimethyl-p-toluidine, N,N-dimethyl-aniline, N,N-(dimethylamino)ethyl-methacrylate, N,N-dimethylamino acetophenone, N,N-dimethylamino benzophenone, N,N-diethylamino benzophenone, N-methylpiperidine, N-ethylpiperidine, N,N-dimethylbenzylamine, N,N-dimethylcyclohexylamine, acryloyl morpholine, morpholinoethyl (meth)acrylate, N,N-dimethylaminoethyl (meth)acrylate, N,N-diethylaminoethyl (meth)acrylate, N,N-dimethylaminoethyl (meth)acrylate, and N,N-dimethylaminopropyl (meth)acrylate. These can be used singly or by mixing two or more kinds thereof. Among them, because of being excellent in the storage stability of the photocurable resin composition, and excellent in the concealing effect of the cured product and in the thick-film curability of the photocurable resin composition, the component (E) is preferably at least one kind selected from the group consisting of a tertiary amine compound in which at least one of the substituents is a straight or branched hydroxyalkyl group having 1 to 8 carbon atoms; acryloyl morpholine, morpholinoethyl (meth)acrylate, dimethylaminoethyl (meth)acrylate, diethylaminoethyl (meth)acrylate, N,N-dimethylaminoethyl (meth)acrylate, and N,N-dimethylaminopropyl (meth)acrylate. Further, in addition to the viewpoint described above, from the viewpoint that the mixing amount of the component (E) to the component (C) described later can be decreased, the component (E) contains more preferably at least one kind of the tertiary amine compounds in which at least one of the substituents is a straight or branched hydroxyalkyl group having 1 to 8 carbon atoms.

The mixing amount of the component (E) of the present invention is, based on 100 parts by mass of the component (C), preferably 0.01 to 200 parts by mass, more preferably 0.05 to 150 parts by mass, and particularly preferably 0.1 to 100 parts by mass. When the mixing amount of the component (E) is 0.1 part by mass or more, the thick-film curability of the photocurable resin composition with active energy rays can be improved, and when the mixing amount of the component (E) is 200 parts by mass, the concealing effect of the cured product can be improved. In addition, in a case where as the component (E), at least one kind of the tertiary amine compounds in which at least one of the substituents is a straight or branched hydroxyalkyl group having 1 to 8 carbon atoms is contained, the mixing amount of the component (E) to the component (C) may be decreased, and is, based on 100 parts by mass of the component (C), 0.01 to 20 parts by mass, preferably 0.05 to 15 parts by mass, and more preferably 0.1 to 10 parts by mass.

Further, as to the mixing amount of the component (E) and the component (B), from the viewpoint of capable of achieving both of the high concealing effect and the high thick-film curability, it is preferred that based on 100 parts by mass of the component (C), the component (E) is 0.01 to 100 parts by mass and the component (B) is 0.01 to 10 parts by mass.

For the present invention, within the range not impairing the effects of the present invention, an additive agent such as various kinds of elastomers of a styrene-based copolymer or the like, a polythiol compound, a sensitizer, a filling material, a storage stabilizer, an antioxidant, a light stabilizer, a storage stabilizer, a heavy metal deactivator, an adhesion imparting agent, a plasticizer, an antifoaming agent, pigment, a rust-preventive agent, a leveling agent, a dispersant, a rheology modifier, a flame retardant, and a surfactant can be used.

Into the present invention, a polythiol compound may be added for the purpose of improving the photocurability. Examples of the polythiol compound include trimethylolpropane tris(3-mercaptopropionate), pentaerythritol tetrakis(3-mercaptopropionate), trimethylolpropane tris(3-mercaptobutyrate), trimethylolethane tris(3-mercaptobutyrate), ethylene glycol bis(3-mercaptoglycolate), butanediol bis(3-mercaptoglycolate), trimethylol propane tris(3-mercaptoglycolate), pentaerythritol tetrakis(3-mercaptoglycolate), tris-[(3-mercaptopropionyloxy)-ethyl]-isocyanurate, pentaerythritol tetrakis(3-mercaptopropionate), tetraethylene glycol bis(3-mercaptopropionate), dipentaerythritol hexakis(3-mercaptopropionate), pentaerythritol tetrakis(3-mercaptobutyrate), 1,4-bis(3-mercaptobutyryloxy)butane, and 1,3,5-tris(3-mercaptobutyryloxyethyl)-1,3,5-triazine-2,4,6(1H,3H,5H)-trione.

Into the present invention, a sensitizer may be added for the purpose of improving the photocurability. Examples of the sensitizer include anthracene, pyrene, perylene, xanthone, thioxanthone, eosin, ketocoumarin, coumarin, and isobenzofuran.

Into the present invention, for the purpose of improving the elastic modulus, the flowability, and the like of the cured product, a filling material in an amount not impairing the thick-film curability and storage stability of the photocurable resin composition may be added. Specific examples of the filling material include organic powder, inorganic powder, and metal powder.

Examples of the filling material of inorganic powder include glass, fumed silica, alumina, mica, ceramics, silicone rubber powder, calcium carbonate, aluminum nitride, carbon powder, kaolin clay, dry clay mineral, and dry diatomaceous earth. The mixing amount of the inorganic powder is, based on 100 parts by mass of the component (A), preferably 0.1 to 100 parts by mass. When the mixing amount of the inorganic powder is 0.1 part by mass or more, effects of improving the elastic modulus, flowability, and the like of the cured product can be obtained, and when the mixing amount of the inorganic powder is 100 parts by mass or less, the photocurable resin composition is excellent in the flowability, and has improved workability.

The fumed silica can be mixed for the purpose of adjusting the viscosity of the photocurable resin composition or improving the mechanical strength of the cured product. The fumed silica that has been surface-treated preferably with dimethylsilane, trimethylsilane, alkylsilane, methacryloxysilane, organochlorosilane, polydimethylsiloxane, hexamethyldisilazane, or the like is used. Examples of the product available on the market of the fumed silica include AEROSIL (registered trademark) R972, R972V, R972CF, R974, R976, R976S, R9200, RX50, NAX50, NX90, RX200, RX300, R812, R812S, R8200, RY50, NY50, RY200S, RY200, RY300, R104, R106, R202, R805, R816, T805, R711, RM50, and R7200 (manufactured by NIPPON AEROSIL CO., LTD.).

Examples of the filling material of organic powder include polyethylene, polypropylene, nylon, crosslinked acryl, crosslinked polystyrene, polyester, polyvinyl alcohol, polyvinyl butyral, and polycarbonate. The mixing amount of the organic powder is, based on 100 parts by mass of the component (A), preferably 0.1 to 100 parts by mass. When the mixing amount of the organic powder is 0.1 part by mass or more, effects of improving the elastic modulus, flowability, and the like of the cured product can be obtained, and when the mixing amount of the inorganic powder is 100 parts by mass or less, the photocurable resin composition is excellent in the flowability, and has improved workability.

Into the present invention, a storage stabilizer may be added. As the storage stabilizer, a radical absorbent such as benzoquinone, hydroquinone, and hydroquinone monomethyl ether, ethylenediamine tetraacetic acid or the 2-sodium salt thereof, a metal chelating agent such as oxalic acid, acetylacetone, and o-aminophenol, or the like can be added.

Into the present invention, an antioxidant may be added. Examples of the antioxidant include a quinone-based compound such as β-naphthoquinone, 2-methoxy-1,4-naphthoquinone, methylhydroquinone, hydroquinone, hydroquinone monomethyl ether, mono-tert-butylhydroquinone, 2,5-di-tert-butylhydroquinone, p-benzoquinone, 2,5-diphenyl-p-benzoquinone, and 2,5-di-tert-butyl-p-benzoquinone; a phenol-based compound such as phenothiazine, 2,2-methylene-bis(4-methyl-6-tert-butylphenol), catechol, tert-butylcatechol, 2-butyl-4-hydroxyanisole, 2,6-di-tert-butyl-p-cresol, 2-tert-butyl-6-(3-tert-butyl-2-hydroxy-5-methylbenzyl)-4-methylphenyl acrylate, 2-[1-(2-hydroxy-3,5-di-tert-pentylphenyl)ethyl]-4,6-di-tert-pentylphenyl acrylate, 4,4'-butylidene bis(6-tert-butyl-3-methylphenol), 4,4'-thio bis(6-tert-butyl-3-methylphenol), 3,9-bis[2-[3-(3-tert-butyl-4-hydroxy-5-methylphenyl)propionyloxy]-1,1-dimethylethyl]-2,4,8,10-tetraoxaspiro[5,5]undecane, pentaerythritol tetrakis[3-(3,5-di-tert-butyl-4-hydroxyphenyl)propionate], thiodiethylene bis[3-(3,5-di-tert-butyl-4-hydroxyphenyl)propionate], octadecyl-3-(3,5-di-tert-butyl-4-hydroxyphenyl)propionate, N,N'-hexane-1,6-diyl bis[3-(3,5-di-tert-butyl-4-hydroxyphenyl)propionamide], benzenepropanoic acid, 3,5-bis(1,1-dimethylethyl)-4-hydroxy, C7 to C9 side-chain alkyl ester, 2,4-dimethyl-6-(1-methylpentadecyl)phenol, diethyl[[3,5-bis(1,1-dimethylethyl)-4-hydroxyphenyl]methyl]phosphonate, 3,3',3'',5,5',5''-hexa-tert-butyl-a,a',a''-(mesitylene-2,4,6-tolyl)tri-p-cresol, calcium diethyl bis[[3,5-bis(1,1-dimethylethyl)-4-hydroxyphenyl]methyl]phosphonate, 4,6-bis(octylthiomethyl)-o-cresol, ethylene bis(oxyethylene)bis[3-(5-tert-butyl-4-hydroxy-m-tolyl)propionate], hexamethylene bis[3-(3,5-di-tert-butyl-4-hydroxyphenyl) propionate, 1,3,5-tris(3,5-di-tert-butyl-4-hydroxybenzyl)-1,3,5-triazine-2,4,6(1H,3H,5H)-trione, 1,3,5-tris[(4-tert-butyl-3-hydroxy-2,6-xylyl)methyl]-1,3,5-triazine-2,4,6(1H,3H,5H)-trione, a reaction product of N-phenylbenzenamine and 2,4,6-trimethylpentene, 2,6-di-tert-butyl-4-(4,6-bis(octylthio)-1,3,5-triazine-2-ylamino)phenol, and picric acid; a phosphorus-based compound such as tris(2,4-di-tert-butylphenyl)phosphite, tris[2-[[2,4,8,10-tetra-tert-butyldibenzo[d,f][1,3,2]dioxaphosphepine-6-yl]oxy]ethyl]amine, bis(2,4-di-tert-butylphenyl)pentaerythritol diphosphite, bis[2,4-bis(1,1-dimethylethyl)-6-methylphenyl]ethyl eater phosphorous acid, tetrakis(2,4-di-tert-butylphenyl) [1,1-bisphenyl]-4,4'-diylbisphosphonite, and 6-[3-(3-tert-butyl-4-hydroxy-5-methylphenyl)propoxy]-2,4,8,10-tetra-tert-butyldibenz[d,f][1,3,2]dioxaphosphepine; dilauryl 3,3'-thiodipropionate, dimyristyl 3,3'-thiodipropionate, distearyl 3,3'-thiodipropionate, pentaerythrityl tetrakis(3-laurylthiopropionate), a lactone-based compound; and a vitamin E-based compound. Among them, a phenol-based compound is suitable.

Into the present invention, an adhesion imparting agent may be added. Examples of the adhesion imparting agent include γ-chloropropyl trimethoxysilane, vinyltrimethoxysilane, vinyltrichlorosilane, vinyltriethoxysilane, vinyl-tris(β-methoxyethoxy)silane, β-(3,4-epoxycyclohexyl)ethyltrimethoxysilane, γ-glycidoxypropyltrimethoxysilane, γ-mercaptopropyltrimethoxysilane, and γ-ureidopropyltriethoxysilane. The mixing amount of the adhesion imparting agent is, based on 100 parts by mass of the component (C), preferably 0.05 to 30 parts by mass, and more preferably 0.2 to 10 parts by mass.

The photocurable resin composition of the present invention can be produced by a known method. For example, the photocurable resin composition can be produced by blending components (A) to (E) each in a predetermined amount, and by mixing the resultant mixture at a temperature of 10 to 70° C. for 0.1 to 5 hours using a mixing measure such as a mixer.

The light source used at the time of curing the photocurable resin composition of the present invention by the irradiation with light such as UV rays, visible light or the like is not particularly limited, and examples of the light source include a low-pressure mercury lamp, a medium-pressure mercury lamp, a high-pressure mercury lamp, an ultrahigh-pressure mercury lamp, a black-light lamp, a microwave excited-mercury lamp, a metal halide lamp, a sodium lamp, a halogen lamp, a xenon lamp, an LED, a fluorescent lamp, sunlight, and an electron beam irradiator. The irradiation amount of the light irradiation is, from the viewpoint of the characteristics of the cured product, preferably 10 kJ/m$^2$ or more, and more preferably 20 kJ/m$^2$ or more. The upper limit of the irradiation amount of the light irradiation is, from the viewpoint of the productivity, preferably 1000 kJ/m$^2$ or less.

The photocurable resin composition of the present invention develops color when the leuco dye that is a component (A) comes into contact with an acid, and a cured product obtained by curing the photocurable resin composition can develop a black color, a blue color, a green color, a red color, or the like. The cured product is, from the viewpoint of being excellent in the concealing effect, preferably a black color.

As the application to suitably use the photocurable resin composition of the present invention, a casting resin, a sealing agent, a sealing material, a potting agent, an adhesive agent, a coating material, a lining material, ink, and the like can be mentioned. Among them, as to the application, the photocurable resin composition of the present invention has excellent storage stability and excellent thick-film curability, the cured product has a high concealing effect, therefore, is preferably applied in a casting resin, a sealing agent, a potting agent, an adhesive agent, or a coating material. In addition, when being used in such application, the photocurable resin composition of the present invention is preferably in a liquid state at 25° C.

As the particularly preferred application of the photocurable resin composition of the present invention, a coating material for a flexible wiring board, a casting resin, a black stripe of lens, an image display device, an optical member, a CMOS sensor, and an adhesive agent for assembling housing and lens, or the like can be mentioned.

EXAMPLES

Hereinafter, the present invention will be further explained in detail by way of Examples, but should not be limited at all by these Examples.

<Preparation of Photocurable Resin Composition>

Each component was collected in an amount of the parts by mass shown in Table 1, the collected components were mixed at room temperature (25° C.) for 60 minutes by a planetary mixer, and a photocurable resin composition was prepared. Further, the detailed preparation amount was determined in accordance with Table 1, the numerical values were all expressed by parts by mass.

<Component (A)> a1: 3-dibutylamino-6-methyl-7-anilinofluoran (ODB-2, manufactured by Yamamoto Chemicals, Inc.)

a2: 3-diethylamino-6-methyl-7-anilinofluoran (ODB, manufactured by Yamamoto Chemicals, Inc.)

<Comparison Component of Component (A)> a'1: carbon black (SRB black T-04, manufactured by MIKUNI COLOR LTD.)

<Component (B)> b1: triarylaulfonium-hexafluorophosphate salt (CPI-100P, manufactured by San-Apro Ltd.)

<Component (C)> c1: urethane (meth)acrylate (UV-3000B, manufactured by The Nippon Synthetic Chemical Industry Co., Ltd.)

c2: isocyanuric acid EO-modified di- and triacrylate (M-313, manufactured by TOAGOSEI CO., LTD.)

c3: dimethylol-tricyclodecane diacrylate (DCP-A, manufactured by KYOEISHA CHEMICAL Co., LTD)

c4: isobornyl acrylate (LIGHT ACRYLATE IBX-A, manufactured by KYOEISHA CHEMICAL Co., LTD)

<Component (D)> d1: 2-hydroxy-2-methyl-1-phenyl-propane-1-one (DAROCUR 1173, manufactured by BASF)

d2: 2,4,6-trimethylbenzoyl-diphenyl-phosphine oxide (LUCIRIN TPO, manufactured by BASF)

<Component (E)> e1: acryloyl morpholine (ACMO, manufactured by KJ Chemicals Corporation)

e2: triisopropanolamine (manufactured by TOKYO CHEMICAL INDUSTRY CO., LTD.)

e3: triethanolamine (manufactured by TOKYO CHEMICAL INDUSTRY CO., LTD.)

e4: N-phenyl diethanolamine (manufactured by TOKYO CHEMICAL INDUSTRY CO., LTD.)

<Comparison Component of Component (E)> e'1: N-methylolacrylamide e'2: methacrylamide e'3: 1,3-bisaminomethylcyclohexane (1,3-BAC, manufactured by MITSUBISHI GAS CHEMICAL COMPANY, INC.)

e'4: 3,3'-dimethyl-4,4'-diaminodiphenylmethane (KAYAHARD A-A, manufactured by Nippon Kayaku Co., Ltd.)

e'5: polyoxypropylene diamine (JEFFAMINE D-230)

e'6: metaxylene diamine (MXDA, manufactured by MITSUBISHI GAS CHEMICAL COMPANY, INC.).

The test method used in Examples and Comparative Examples was as follows.

<Appearance Check of Cured Product>

A test piece having a smooth surface was prepared so as to have a thickness of the photocurable resin composition of 0.5 mm, and the test piece was subjected to UV irradiation under the conditions of 100 mW/cm$^2$×120 seconds using an LED irradiator (at a wavelength of 365 nm) to obtain a cured product. The appearance of the cured product was visually observed, and the results were shown in Table 1.

<Evaluation of Concealing Effect>

A test piece having a smooth surface was prepared so as to have a thickness of the curable resin composition of 0.5 mm, and the test piece was subjected to UV irradiation under the conditions of 100 mW/cm$^2$×120 seconds using an LED irradiator (at a wavelength of 365 nm) to obtain a cured product. The obtained cured product was placed on a sheet of paper on which a black spot had been marked, the black spot was visually observed, and evaluation was performed based on the following criteria. The results were shown in Table 1.

[Evaluation Criteria]

◯: A case where the outline of the black spot was unclear, and the concealing effect was confirmed x: A case where the outline of the black spot was distinctly confirmed <Evaluation of Thick-Film Curability>

A photocurable resin composition was put in a metal cylinder having a depth of 5 mm, and was subjected to UV irradiation under the conditions of 100 mW/cm$^2$×120 seconds using an LED irradiator (at a wavelength of 365 nm) to be photo-cured so as to obtain a cured product. In addition, uncured portion was removed with a solvent, the cured portion was measured by a vernier caliper, and the thick-film curability was calculated. The results were shown in Table 1.

Further, in order to apply in a casting resin, the thick-film curability with 1 mm or more is preferred.

<Evaluation of Storage Stability>

A curable resin composition in an amount of 5 g was put into a light-shielded container in a room at 25° C., and sealed and stored for one month. After that, the curable resin composition was visually evaluated based on the following criteria. The results were shown in Table 1.

[Evaluation Criteria]

◯: Remained in a liquid state, and the storage stability was favorable x: Gelation was confirmed

TABLE 1

| Component | | Example 1 | Example 2 | Example 3 | Example 4 | Example 5 | Example 6 | Example 7 | Comparative Example 1 |
|---|---|---|---|---|---|---|---|---|---|
| (A) | a1 | 0.5 | 0.5 | 0.5 | 0.5 | 0.5 | 0.5 | | 0.5 |
| | a2 | | | | | | | 0.5 | |
| Comparison | a'1 | | | | | | | | |
| (B) | b1 | 3 | 3 | 3 | 3 | 3 | 3 | 3 | 3 |
| (C) | c1 | 30 | 30 | 30 | 30 | 30 | 30 | 30 | 30 |
| | c2 | 10 | 10 | 10 | 10 | 10 | 10 | 10 | 10 |
| | c3 | 10 | 10 | 10 | 10 | 10 | 10 | 10 | 10 |
| | c4 | | 40 | 40 | | | | | 50 |
| (D) | d1 | 3 | 3 | 3 | 3 | 3 | 3 | 3 | 3 |
| | d2 | 0.3 | 0.3 | 0.3 | 0.3 | 0.3 | 0.3 | 0.3 | 0.3 |
| (E) | e1 | 50 | 10 | 10 | | | | | |
| | e2 | | | 0.1 | 0.3 | | | 0.3 | |
| | e3 | | | | | 0.3 | | | |
| | e4 | | | | | | 0.3 | | |
| Comparison | e'1 | | | | | | | | |
| | e'2 | | | | | | | | |
| | e'3 | | | | | | | | |
| | e'4 | | | | | | | | |
| | e'5 | | | | | | | | |
| | e'6 | | | | | | | | |
| Appearance check | | Black | Black | Black | Black | Black | Black | Black | Black |
| Concealing effect | | ○ | ○ | ○ | ○ | ○ | ○ | ○ | ○ |
| Thick-film curability | | 1.5 mm | 1.2 mm | 1.8 mm | 2.1 mm | 1.8 mm | 1.6 mm | 1.9 mm | 0.9 mm |
| Storage stability | | ○ | ○ | ○ | ○ | ○ | ○ | ○ | ○ |

| Component | | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| (A) | a1 | 0.5 | 0.5 | 0.5 | 0.5 | 0.5 | 0.5 | |
| | a2 | | | | | | | |
| Comparison | a'1 | | | | | | | 0.1 |
| (B) | b1 | 3 | 3 | 3 | 3 | 3 | 3 | 3 |
| (C) | c1 | 30 | 30 | 30 | 30 | 30 | 30 | 30 |
| | c2 | 10 | 10 | 10 | 10 | 10 | 10 | 10 |
| | c3 | 10 | 10 | 10 | 10 | 10 | 10 | 10 |
| | c4 | | | | | | | |
| (D) | d1 | 3 | 3 | 3 | 3 | 3 | 3 | 3 |
| | d2 | 0.3 | 0.3 | 0.3 | 0.3 | 0.3 | 0.3 | 0.3 |
| (E) | e1 | | | | | | | 50 |
| | e2 | | | | | | | |
| | e3 | | | | | | | |
| | e4 | | | | | | | |
| Comparison | e'1 | 0.1 | | | | | | |
| | e'2 | | 0.1 | | | | | |
| | e'3 | | | 0.1 | | | | |
| | e'4 | | | | 0.1 | | | |
| | e'5 | | | | | 0.1 | | |
| | e'6 | | | | | | 0.1 | |
| Appearance check | | Not dissolved | Gelation was confirmed during composition production. | | | | | Black |
| Concealing effect | | | | | | | | ○ |
| Thick-film curability | | | | | | | | 0.2 mm |
| Storage stability | | | | | | | | ○ |

According to Table 1, it can be understood that each of Examples 1 to 7 uses a photocurable resin composition containing a tertiary amine compound of a component (E), and the photocurable resin composition has excellent thick-film curability and excellent storage stability, and the cured product has a high concealing effect.

In addition, it can be understood that Comparative Example 1 uses a photocurable resin composition without containing the component (E) of the present invention, and the photocurable resin composition has poor thick-film curability as compared with that in Examples 1 to 7. Further, Comparative Examples 2 and 3 use photocurable resin compositions containing a component e'1 and a component e'2, respectively, which are not the component (E) of the present invention, and the photocurable resin compositions were not able to be dissolved in the component (C) of the present invention. In addition, Comparative Examples 4 to 7 use photocurable resin compositions containing any one of the components e'3 to e'6, which are a primary or secondary amine compound and not the component (E) of the present invention, and gelation of each of the photocurable resin compositions was confirmed during the composition production, therefore, the storage stability was resulted in poor. Further, Comparative Example 8 uses a photocurable resin composition containing carbon black that is not the component (A) of the present invention, and the thick-film curability of the photocurable resin composition was resulted in significantly poor, which was caused by UV rays absorption of the carbon black.

<Transmittance Measurement of Cured Product>

A test piece having a smooth surface was prepared so as to have a thickness of the curable resin composition in Examples 1 to 7 of 150 μm, and the test piece was subjected to UV irradiation under the conditions of 100 mW/cm$^2$×120 seconds to obtain a cured product. The transmittance of the cured product was measured by a spectrophotometer UV-2450 (manufactured by Shimadzu Corporation) (not described in Table 1). In the evaluation results of the cured products of the curable resin compositions in Examples 1 to 7, the transmittance at a wavelength of 550 nm was 3% or less and the excellent concealing effect was confirmed in all of the cured products.

INDUSTRIAL APPLICABILITY

The photocurable resin composition of the present invention is excellent in the storage stability, and has a high concealing effect and thick-film curability, therefore, is suitably used in various adhesive applications. Specifically, the photocurable resin composition is extremely effective as a coating material, a casting resin, a sealing agent, a sealing material, a potting agent, an adhesive agent, a coating material, a lining material, an adhesive agent, ink, or the like, and can be applied in a wide range of fields.

Further, the application of the present invention is not limited to the embodiments described above, and appropriate changes may be made in the range where the gist of the present invention is not impaired.

This application is based on Japanese Patent Application No. 2014-197803, filed with the Japan Patent Office on Sep. 29, 2014, the entire content of which is hereby incorporated by reference.

The invention claimed is:

1. A photocurable resin composition comprising components (A) to (E):
    a component (A): a leuco dye, wherein the leuco dye is at least one member selected from the group consisting of 3-dibutylamino-6-methyl-7-anilinofluoran, 3-dipropylamino-6-methyl-7-anilinofluoran, 3-diethylamino-6-methyl-7-anilinofluoran, 3-dimethylamino-6-methyl-7-anilinofluoran, 3-diethylamino-6-methyl-7-xylidinofluorane, and 3-(4-diethylamino-2-ethoxyphenyl)-3-(1-ethyl-2-methylindole-3-yl)-4-azaphthalide;
    a component (B): a photoacid generator;
    a component (C): radical polymerizable compounds comprising an oligomer and a monomer, wherein
    the oligomer is at least one member selected from the group consisting of urethane (meth)acrylate having a polybutadiene skeleton, urethane (meth)acrylate having a hydrogenated polybutadiene skeleton, urethane (meth) acrylate having a polycarbonate skeleton, urethane (meth)acrylate having a polyether skeleton, urethane (meth)acrylate having a polyester skeleton, urethane (meth)acrylate having a castor oil skeleton, isoprene-based (meth)acrylate, hydrogenated isoprene-based (meth)acrylate, epoxy (meth)acrylate and (meth) acrylic group-containing acrylic polymer, and wherein
    the monomer is at least one selected from the group consisting of acrylic acid, ethyl (meth)acrylate, n-butyl (meth)acrylate, tert-butyl (meth)acrylate, isobutyl methacrylate, 2-ethylhexyl (meth)acrylate, isodecyl (meth)acrylate, butoxydiethylene glycol (meth)acrylate, methoxypolyethylene glycol (meth)acrylate, 2-methacryloyloxyethyl succinic acid, 2-methacryloyloxyethyl hexahydrophthalic acid, glycidyl (meth)acrylate, lauryl (meth)acrylate, stearyl (meth)acrylate, tetrahydrofurfuryl (meth)acrylate, caprolactone-modified tetrahydrofurfuryl (meth)acrylate, cyclohexyl (meth)acrylate, dicyclopentanyl (meth)acrylate, dicyclopentenyl (meth)acrylate, dicyclopentenyloxy(meth)acrylate, isobornyl(meth)acrylate, adamantyl (meth)acrylate, benzyl (meth)acrylate, phenyl (meth)acrylate, phenoxyethyl (meth)acrylate, phenoxydiethylene glycol (meth)acrylate, phenoxytetraethylene glycol (meth)acrylate, nonylphenoxyethyl (meth)acrylate, butoxyethyl (meth)acrylate, 2hydroxyethyl (meth)acrylate, 2-hydroxypropyl (meth)acrylate, 4-hydroxybutyl (meth)acrylate, glycerol (meth)acrylate, trifluoroethyl (meth)acrylate, methacryloxyethyl acid phosphate, 2-hydroxyethyl methacrylic acid phosphate. γ-methacryloxypropyltrimethoxysilane, γ-acryloxypropyltrimethoxysilane, ethylene glycol di(meth)acrylate, diethylene glycol di(meth)acrylate. triethylene glycol di(meth)acrylate, tetraethyene glycol dimethacrylate, 1,6-hexanediol di(meth)acrylate, 1,9-nonanediol di(meth)acrylate, glycerin di(meth)acrylate, neopentyl glycol di(meth) acrylate, stearic acid-modified pentaerythritol di(meth) acrylate, dicyclopentenyl diacrylate, di(meth)acryloyl isocyanurate, alkylene oxide-modified bisphenol di(meth)acrylate, dimethylol-tricyclodecane diacrylate, trimethylolpropane tri(meth)acrylate, pentaerythritol tri(meth)acrylate, tris(acryloyloxyethyl), ditrimethylol propane tetra(meth)acrylate, pentaerythritol tetra(meth) acrylate, dipentaerythritol monohydroxv penta(meth) acrylate, alkyl-modified dipentaerythritol pentaacrylate, dipentaerythritol hexa(meth)acrylate. and isocyanuric acid EO-modified di- and triacrylate;
    a component (D): a photoradical polymerization initiator, wherein the component (D) comprises at least one of an acetophenone-based photoradical polymerization initiator and an acylphosphine oxide-based photoradical polymerization initiator; and
    a component (E): a tertiary amine compound, wherein the tertiary amino compound is at least one member selected from the group consisting of N-phenyl diethanolamine, N-methyl diethanolamine, p-methylphenyl diethanolamine, N-ethyl diethanolamine, N-propyl diethanolamine, N-butyl diethanolamine, triethanolamine, tributanolamine, triisopropanolamine, N-methyl-diethanolamine, N-methyl-dimethanolamine, trimethylamine, triethylamine, tributylamine, N,N-dimethyl-p-toluidine, N,N-dimethyl-aniline, N,N-(dimethylamino)ethyl-methacrylate, N,N-dimethylamino acetophenone, N,N-dimethylamino benzophenone, N,N-diethylamino benzophenone, N-methylpiperidine, N-ethylpiperidine, N,N-dimethylbenzylamine, dimethylcyclohexylamine, acryloyl morpholine, morpholinoethyl (meth)acrylate, N,N -dimethylaminoethyl (meth)acrylate, N,N-diethylaminoethyl(meth)acrylate, and N,N-dimethylaminopropyl (meth)acrylate.

2. The photocurable resin composition according to claim 1, comprising 0.01 to 200 parts by mass of the component (E) based on 100 parts by mass of the component (C).

3. The photocurable resin composition according to claim 1, comprising 0.01 to 100 parts by mass of the component (E) and 0.01 to 10 parts by mass of the component (B) based on 100 parts by mass of the component (C).

4. The photocurable resin composition according to claim 1, wherein
    the component (B) is an onium salt-based photoacid generator.

5. The photocurable resin composition according to claim 1, wherein
the component (B) is an aryl sulfonium salt.

6. The photocurable resin composition according to claim 1, wherein
a cured product is a black color.

7. The photocurable resin composition according to claim 1, wherein
the photocurable resin composition is a photocurable resin composition for a casting resin, a sealing agent, a potting agent, an adhesive agent, or a coating material.

8. The photocurable resin composition according to claim 1, wherein
the component (E) is at least one member selected from the group consisting of N-phenyl diethanolamine, N-methyl diethanolamine, p-methylphenyl diethanolamine, N-ethyl diethanolamine, N-propyldiethanolamine, N-butyldiethanolamine, triethanolamine, tributanolamine, triisopropanolamine, N-methyldiethanolamine, N-methyl-dimethanolamine, acryloyl morpholine, morpholinoethyl (meth)acrylate, N,N-dimethylaminoethyl (meth)acrylate, N,N-diethylaminoethyl(meth)acrylate, and N,N-dimethylaminopropyl (meth)acrylate.

9. The photocurable resin composition according to claim 1, wherein
the oligomer is at least one selected from the group consisting of urethane (meth)acrylate having a polybutadiene skeleton, urethane (meth)acrylate having a hydrogenated polybutadiene skeleton, urethane (meth)acrylate having a polycarbonate skeleton, urethane (meth)acrylate having a polyether skeleton, urethane (meth)acrylate having a polyester skeleton, and urethane (meth)acrylate having a castor oil skeleton.

* * * * *